United States Patent
Jin

(10) Patent No.: US 10,079,069 B2
(45) Date of Patent: Sep. 18, 2018

(54) ARRAY SUBSTRATE AND METHOD FOR FORMING THE SAME

(71) Applicants: Shanghai AVIC OPTO Electronics Co., Ltd., Shanghai (CN); Tianma Micro-Electronics Co., Ltd., Shenzhen (CN)

(72) Inventor: Huijun Jin, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 161 days.

(21) Appl. No.: 15/048,792

(22) Filed: Feb. 19, 2016

(65) Prior Publication Data
US 2016/0293270 A1 Oct. 6, 2016

(30) Foreign Application Priority Data

Apr. 1, 2015 (CN) .......................... 2015 1 0152986

(51) Int. Cl.
*G11C 19/28* (2006.01)
*G06F 3/041* (2006.01)
(Continued)

(52) U.S. Cl.
CPC .......... *G11C 19/287* (2013.01); *G06F 3/0412* (2013.01); *G06F 3/0416* (2013.01); *G06F 3/047* (2013.01); *G06F 2203/04103* (2013.01)

(58) Field of Classification Search
CPC ... G11C 19/287; G06F 3/0412; G06F 3/0416; G06F 2203/04103; G06F 3/044; G06F 3/047
See application file for complete search history.

(56) References Cited

U.S. PATENT DOCUMENTS

2009/0296038 A1 12/2009 Yoon et al.
2012/0313905 A1 12/2012 Kang et al.
(Continued)

FOREIGN PATENT DOCUMENTS

CN 10149055 A * 4/2009
CN 101409055 A 4/2009
(Continued)

OTHER PUBLICATIONS

Chinese Application No. 201510152986.9, First Office Action dated Sep. 5, 2016.

*Primary Examiner* — Julie Anne Watko
(74) *Attorney, Agent, or Firm* — Alston & Bird LLP

(57) ABSTRACT

An array substrate and a method for forming the same are provided. The array substrate includes: a gate driver in a non-display area, wherein the gate driver includes M shift register circuits and each shift register circuit includes two shift register groups, which includes N shift registers each, where M is a positive even number and N is a positive integer greater than 2; in each of the shift register groups, a gate output end of an $n^{th}$ shift register has signal wires; along a direction perpendicular to the non-display area, at least one of the signal wires of one shift register group are stacked above at least one of the signal wires of another shift register group. Accordingly, a display panel using this array substrate may realize a narrow side frame design.

16 Claims, 10 Drawing Sheets

(51) Int. Cl.
   *G06F 3/047*      (2006.01)
   *G06F 3/044*      (2006.01)

(56) References Cited

U.S. PATENT DOCUMENTS

2015/0270291 A1    9/2015   Tian et al.
2016/0035747 A1    2/2016   Zhang et al.

FOREIGN PATENT DOCUMENTS

| | | | |
|---|---|---|---|
| CN | 201788340 U | * | 4/2011 |
| CN | 102183860 A | | 9/2011 |
| CN | 102270413 A | | 12/2011 |
| CN | 202306075 U | | 7/2012 |
| CN | 102819995 A | | 12/2012 |
| CN | 103474435 A | | 12/2013 |
| CN | 103901690 A | | 7/2014 |
| KR | 20090125501 A | | 12/2009 |
| KR | 20140078266 A | | 6/2014 |
| WO | 2013080520 A1 | | 6/2013 |

* cited by examiner

ARRAY SUBSTRATE AND METHOD FOR FORMING THE SAME

CROSS-REFERENCE TO RELATED APPLICATIONS

The present application claims priority to Chinese patent application No. 201510152986.9, filed on Apr. 1, 2015 with the State Intellectual Property Office of People's Republic of China, and entitled "ARRAY SUBSTRATE AND METHOD FOR FORMING THE SAME", the entire disclosure of which is incorporated herein by reference.

TECHNICAL FIELD

The present disclosure generally relates to the display technology field, and more particularly to an array substrate and a method for forming the same.

BACKGROUND

Liquid Crystal Displays (LCD) and Organic Light-Emitting Diode (OLED) displays possess advantages such as low radiation, small volume, low energy consumption, and the like. These displays are widely used on information products such as laptops, Personal Digital Assistants (PDA), flat-screen televisions, mobile phones, and the like.

For instance, a LCD uses an external driving chip to drive on-panel chip for image display. However, in order to reduce the quantity of components and manufacturing costs, nowadays it is common to form a driving circuit structure directly on a display panel. For example, gate drivers may be integrated onto array substrates. Furthermore, in current practices, more and more gate drivers are formed using shift registers and integrated on array substrates of liquid crystal panels.

Nevertheless, integrating a gate driver onto an array substrate may occupy an area of the array substrate. In the array substrate, the number of pixels in unit area of the array substrate directly correspond to number of output ends of the gate driver, and thereby the gate driver occupies a larger area of the liquid crystal panel. In addition, in the gate driver, the more shift register groups the gate driver employs, the larger area of the array substrate the gate driver occupies. It is known that the gate driver impedes a narrow frame design of the array substrate, and is an obstacle to a narrow side frame design of the display panel.

SUMMARY

The present disclosure provides an array substrate and a method for forming the same, which may reduce an area occupied by a gate driver on the array substrate and achieve a narrow side frame design of a display panel.

In order to solve the problem stated hereinbefore, an array substrate is provided. The array substrate may include:

a gate driver in a non-display area, including M shift register circuits each of which includes a first shift register group and a second shift register group, and the first and second shift register group each include N shift registers, where M is a positive even number and N is a positive integer greater than two, wherein, in each of the shift register groups, a gate output end of an $n^{th}$ shift register may be electrically connected to signal wires including an end signal wire and a start signal wire, where the end signal wire may be electrically connected to an $(n-1)^{th}$ shift register and the start signal wire may be electrically connected to an $(n+1)^{th}$ shift register, where n is a positive integer ranging from 1 to N, wherein, along a direction perpendicular to the non-display area, at least one of the signal wires of the first shift register group may be stacked above at least one of the signal wires of the second shift register group.

In order to solve the problem stated hereinbefore, a method for forming an array substrate is provided. The method may include:

forming a gate driver in a non-display area;

setting the gate driver including M shift register circuits, where M is a positive even number;

setting each of the shift register circuits including a first shift register group and a second shift register group;

setting each of the shift register groups including N shift registers, where N is a positive integer greater than two;

forming signal wires electrically connected to a gate output end of an $n^{th}$ shift register included in each of the shift register groups, and the signal wires include an end signal wire and a start signal wire, wherein setting the end signal wire electrically connected to an $(n-1)^{th}$ shift register and the start signal wire electrically connected to an $(n+1)^{th}$ shift register, where n is a positive integer ranging from 1 to N, wherein, along a direction perpendicular to the non-display area, at least one of the signal wires of the first shift register group may be stacked above at least one of the signal wires of the second shift register group.

Compared to known technology, the present disclosure possesses at least the following advantages: in the present disclosure, at least one of the signal wires of the first shift register group may be stacked above at least one of the signal wires of the second shift register group to reduce quantity of the signal wires arranged side by side in the gate driver so as to narrow a width of the side-by-side arranged signal wires, which may reduce a side frame area and the non-display area of the array substrate, and thereby, the narrow side frame design may be realized employing the display panel with the array substrate.

DETAILED DESCRIPTION

Figure 1:
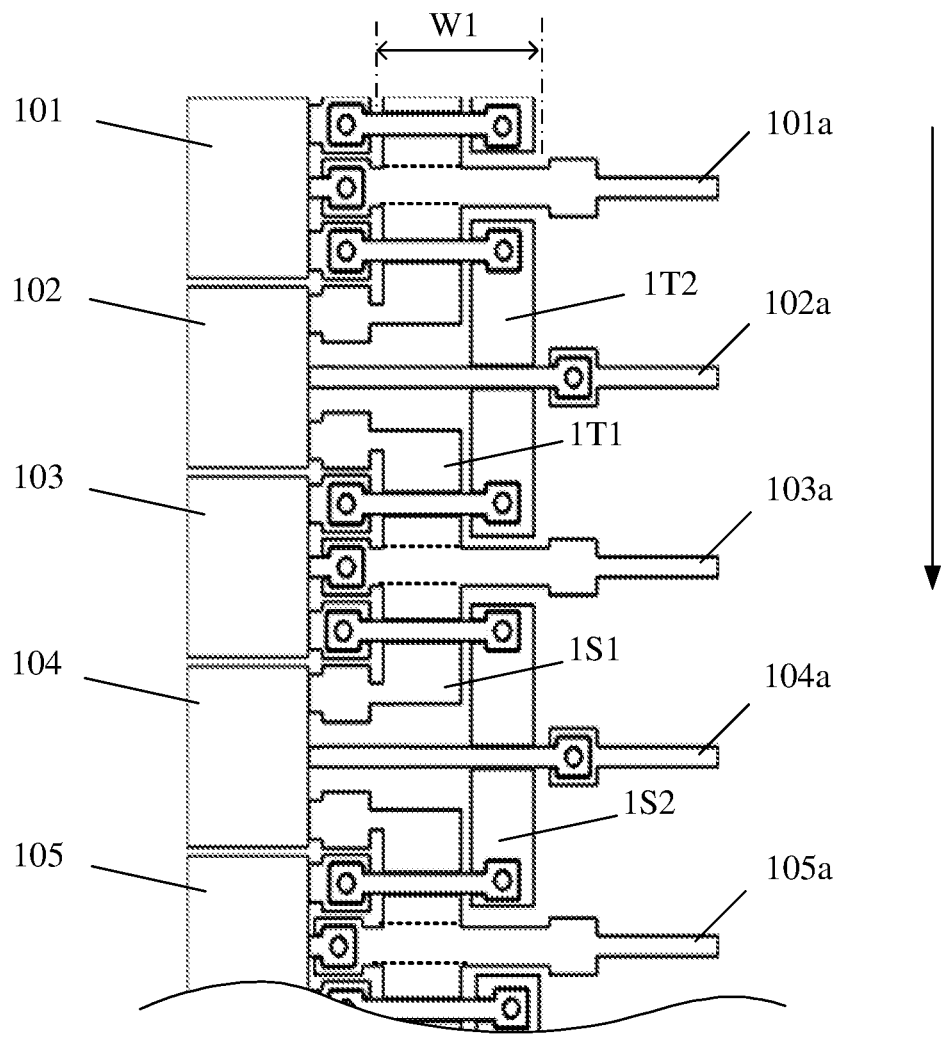
FIG. 1 schematically illustrates a structural top view of a part of an array substrate according to prior art.

In order to clarify the objects, characteristics, and advantages of the present disclosure, embodiments of the present disclosure will be described in detail in conjunction with the accompanying drawings. FIG. 1 schematically illustrates a structural top view of a part of an array substrate, and a partial non-display area of the array substrate. The non-display area may include a gate driver. The gate driver may include shift register circuits. The shift register circuits may include two shift register groups each, which include a first shift register group and a second shift register group. Each of the shift register groups may include multiple shift registers. FIG. 1 presents shift registers 101 to 105 with gate output ends 101a to 105a respectively. Wherein, a $k^{th}$ shift register is included in the first shift register group, where k is an odd number. For example, the shift register 101, shift register 103 and shift register 105 shown in FIG. 1 are included in the first shift register group. A $p^{th}$ shift register is included in the second shift register group, where p is an even number. For example, the shift register 102 and shift register 104 shown in FIG. 1 are included in the second shift register group. The shift registers in each of shift register groups are interconnected by signal wires. Wherein, the signal wires of the first shift register group include a start signal wire 1S1 and an end signal wire 1T1, and the signal wires of the second shift register group include a start signal wire 1S2 and an end signal wire 1T2. In a plane shown in FIG. 1, the start signal wire 1S1 and end signal wire 1T1 of the first shift register group are on a left side of the start signal wire 1S2 and end signal wire 1T2 of the second shift register group, and the start signal wire 1S1, 1S2 and the end signal wire 1T1, 1T2 are on a same plane.

It should be noted that the arrow in FIG. 1 shows the sequence of the shift registers, and in some of the following figures, there are also arrows showing the sequence of shift registers.

Referring to FIG. 1, the signal wires of the two shift register groups are on the same plane, and are arranged side by side, where a total width of the side-by-side structure is width W1, as labeled in FIG. 1. The width W1 may be large so that the side frame area of the array substrate may become large as well, and consequently, a narrow side frame design of a display panel may not be achieved.

Figure 2:
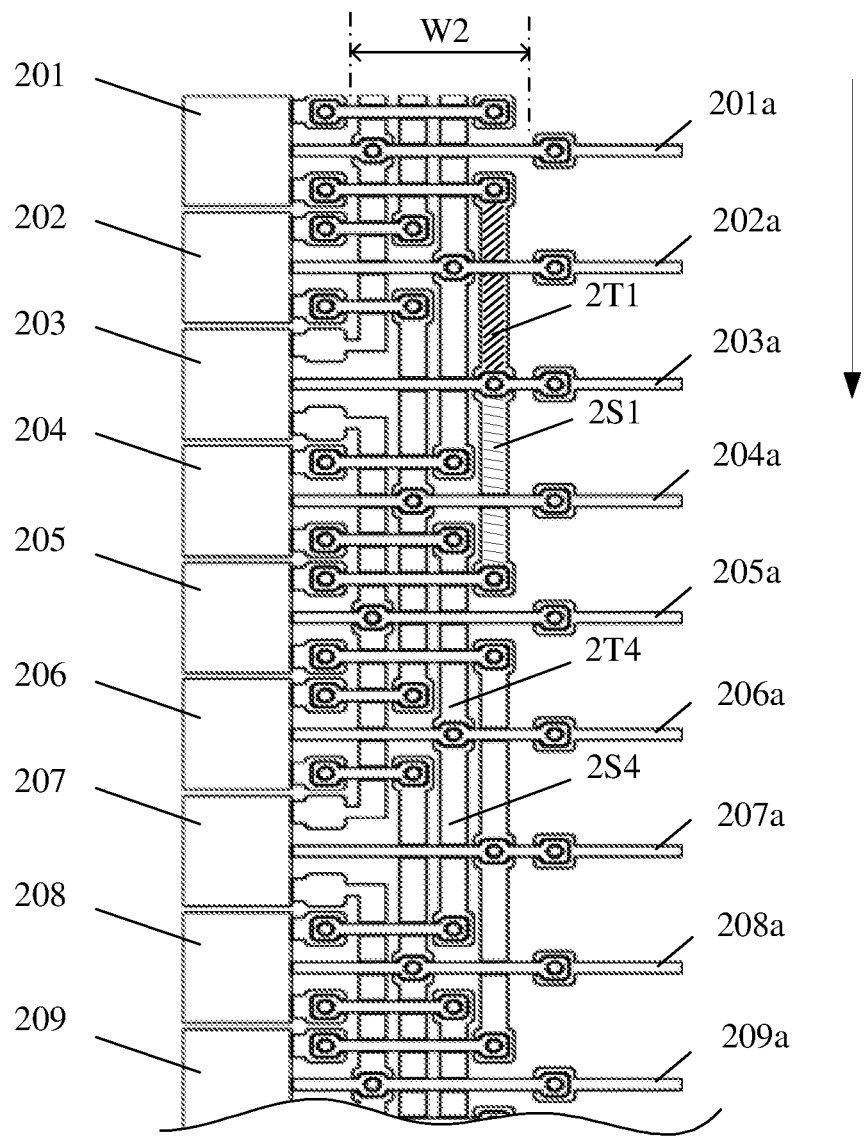
FIG. 2 schematically illustrates a structural top view of a part of another array substrate according to prior art.

FIG. 2 schematically illustrates a structural top view of a part of another array substrate, and a partial non-display area of the array substrate is presented. The non-display area may include a gate driver. The gate driver may include shift register circuits. The shift register circuits may each include four shift register groups, comprising a first shift register group, a second shift register group, a third shift register group and a fourth shift register group. Each of the shift register groups may include multiple shift registers. FIG. 2 presents shift registers 201 to 209 as representatives with gate output ends 201a to 209a respectively. A $(4j-3)^{th}$ shift register is included in the first shift register group, a $(4j-2)^{th}$ shift register is included in the second shift register group, a $(4j-1)^{th}$ shift register is included in the third shift register group and a $(4j)^{th}$ shift register is included in the fourth shift register group, where j is a positive integer. For example, among the shift registers 201 to 209 shown in FIG. 2, the shift register 201, shift register 205 and shift register 209 are included in the first shift register group, shift register 202 and shift register 206 are included in the second shift register group, shift register 203 and shift register 207 are included in the third shift register group, and the shift register 204 and shift register 208 are included in the fourth shift register group. The shift registers in each of the shift register groups are interconnected by signal wires. The signal wires of the first shift register group include a start signal wire 2S1 and an end signal wire 2T1, the signal wires of the fourth shift register group include a start signal wire 2S4 and an end signal wire 2T4, and the signal wires of the other two shift register groups are not labeled. In a plane shown in FIG. 2, the signal wires of the four shift register groups are on a same plane.

Referring to FIG. 2, the signal wires of the four shift register groups are on the same plane, and arranged side by side and in order, where the total width of the side-by-side structure is a width W2 labeled in FIG. 2. The width W2 may be large so that the side frame area of the array substrate may also become large, and the narrow side frame design of the display panel may not be achieved consequently.

Therefore, the present disclosure provides an array substrate and a method for forming the same. In the array substrate, at least one of the signal wires of one shift register group may be stacked above at least one of the signal wires of another shift register group, where the gate driver may include less side-by-side arranged signal wires so that the side-by-side structure of the signal wires may have a narrower width, which may reduce the side frame area and the non-display area of the array substrate, and thereby, the narrow side frame design of the display panel may be realized by employing the array substrate in the following.

Furthermore, a corresponding group of signal wires may be formed using art for forming touch-control display wires, and other groups of the signal wires may be formed using other inductive layers formed on a display area, which may not only save space, but also reduce manufacturing steps and cost.

Figure 3:
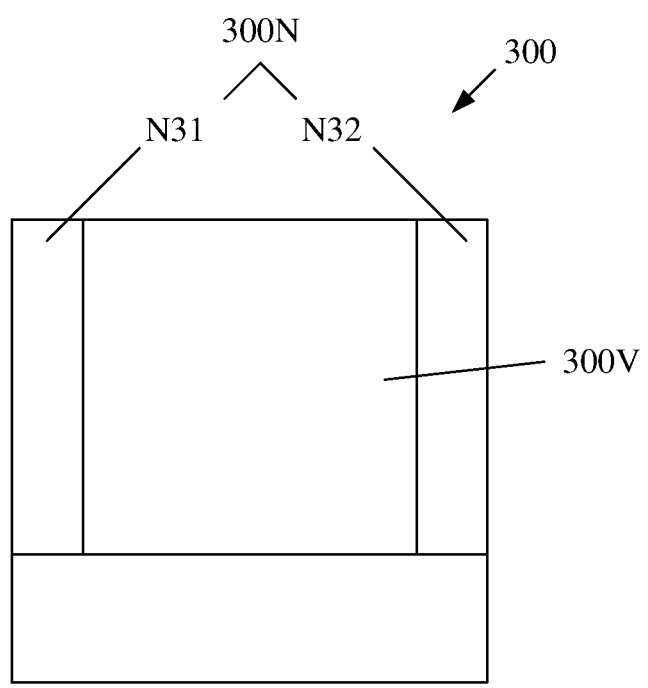
FIG. 3 schematically illustrates a diagram of an array substrate according to an embodiment of the present disclosure.
Figure 4:
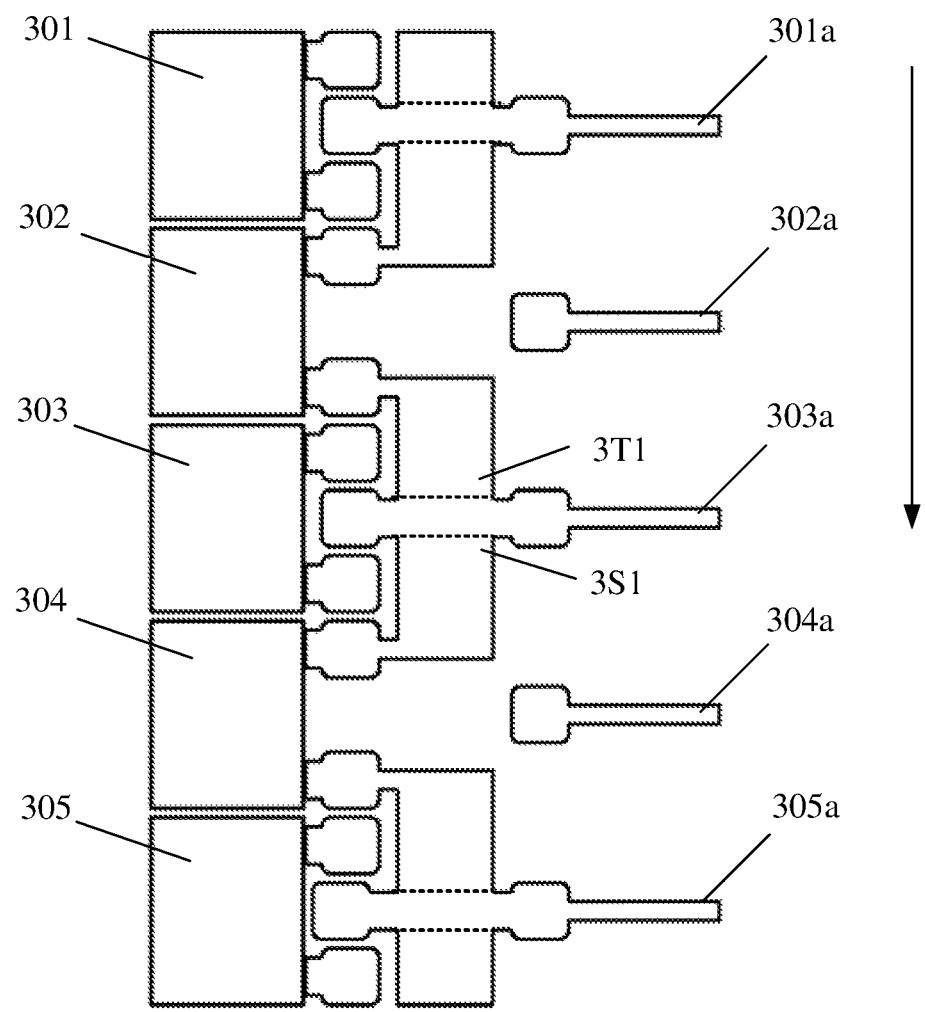
FIG. 4 schematically illustrates a diagram of signal wires in a first layer of a gate driver in a first side frame area of the array substrate shown in FIG. 3.
Figure 5:
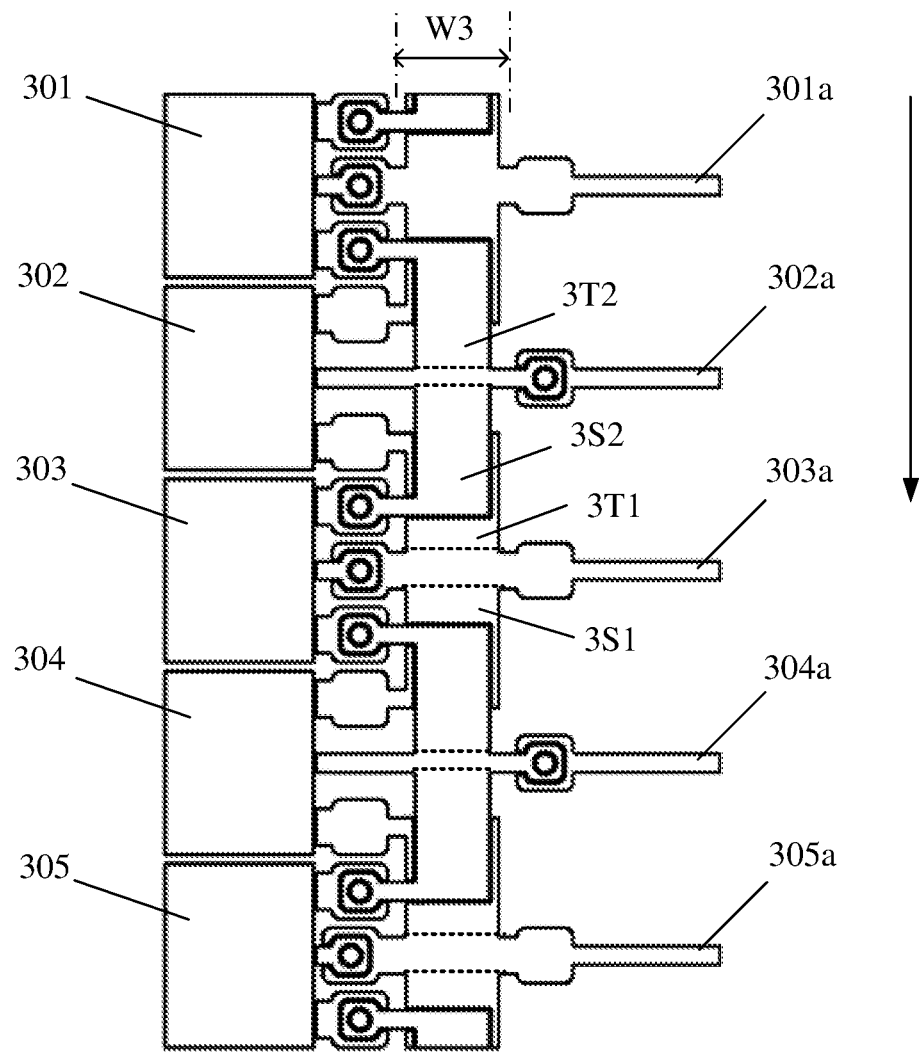
FIG. 5 schematically illustrates a diagram of signal wires in a second layer of the gate driver in the first side frame area of the array substrate shown in FIG. 3.

An array substrate according to the present disclosure is provided referring to FIGS. 3 to 5.

FIG. 3 schematically illustrates a diagram of an array substrate 300 according to one embodiment of the present disclosure. The array substrate 300 includes a display area 300V and a non-display area 300N, and the non-display 300N includes a first side frame area N31 and a second side frame area N32. The array substrate 300 includes a gate driver (not shown) in the non-display area 300N.

In one embodiment, half of the gate driver may be in the first side frame area N31, and the other half of the gate driver may be in the second side frame area N32, that is, the gate driver may be in both side frame areas of the non-display area 300N. In some embodiments, the gate driver may be in either the first side frame area N31 or the second side frame area N32.

In one embodiment, the gate driver may include two shift register circuits each of which may include two shift register groups. The two shift register circuits may include four shift register groups in total. In some embodiments, the gate driver may include M shift register circuits, where M is a positive even number. Each of the M shift register circuits may include two shift register groups. Two shift register groups in a same shift register circuit may have drive signals with a phase difference of a half clock period.

In one embodiment, the gate driver in the first side frame area N31 may include a shift register circuit, which may include two shift register groups. The first side frame area N31 may include two shift register groups, comprising a first shift register group and a second shift register group of the first side frame area N31. Correspondingly, a third shift register group and a fourth shift register group may be included in the second side frame area N32.

Now with reference to FIGS. 4 and 5, FIG. 4 schematically illustrates a diagram of signal wires in a first layer of the gate driver on the array substrate 300 and FIG. 5 schematically illustrates a diagram of signal wires in a second layer of the gate driver on the array substrate 300.

Specifically, although the gate driver in the second side frame area N32 is not shown in FIG. 3, the gate driver in the second side frame area N32 may also include two shift register groups. A structure of the gate driver in the second side frame area N32 is symmetrical to the structure shown in FIGS. 4 and 5, where pixel rows corresponding to the first side frame area N31 and pixel rows corresponding to the second side frame area N32 are alternately arranged.

In an embodiment, each of the shift register groups may include N shift registers, where N is a positive integer greater than 2. Specifically, since there are four shift register groups in total, the gate driver may drive 4N pixel rows, where N is a quarter of total number of the pixel rows. For example, when there are 1024 pixel rows, each of the shift register groups may have 256 shift registers.

FIGS. 4 and 5 illustrate a part of the shift registers in the first and second shift register group of the first side frame area N31. Specifically, shift registers 301 to 305 are presented. In the first side frame area N31, the first shift register group includes a $k^{th}$ shift register, where k is an odd number, and the second shift register group includes a $p^{th}$ shift register, where p is an even number. Thus, the shift register 301, 303 and 305 are included in the first shift register group, and the shift register 302 and 304 are included in the second shift register group.

The shift registers 301 to 305 have gate output ends 301a to 305a respectively. The display area 300V shown in FIG. 3 may have multiple gate wires (not shown), and the gate wires are used to control on-off of pixels in each row. The gate output end of each shift register is electrically connected to one of the gate wires so that each of the shift registers may correspondingly control on-off of one pixel row.

In this embodiment, each of the shift register groups may have signal wires. Specifically, in each of the shift register groups, a gate output end of an $n^{th}$ shift register may have the signal wires including an end signal wire and a start signal wire. The end signal wire of the $n^{th}$ shift register is electrically connected to an $(n-1)^{th}$ shift register and the start signal wire of the $n^{th}$ shift register is electrically connected to an $(n+1)^{th}$ shift register, where n is a positive integer ranging from 1 to N, N is a positive integer greater than two.

For example, when each of the shift register groups includes 256 shift registers, the second shift register to the $255^{th}$ shift register all have the above feature. Namely, among three consecutive shift registers, a gate output end of the middle shift register has two signal wires that are an end signal wire and a start signal wire. In each of shift register groups, when one shift register sends a signal for turning a pixel row on, the end signal wire correspondingly sends an end signal to a previous shift register to stop the previous shift register, and the start signal wire correspondingly sends a start signal to a next shift register to start the next shift register.

In one embodiment, the signal wires of the first shift register group include a start signal wire 3S1 and an end signal wire 3T1, and the signal wires of the second shift register group include a start signal wire 3S2 and an end signal wire 3T2.

In one embodiment, the signal wires of one shift register circuit may be in a same layer, and generally, the signal wires of one shift register circuit may be formed employing a same art.

In one embodiment, the signal wires of the second shift register group may be stacked above the signal wires of the first shift register group. Specifically, referring to FIG. 5, the signal wires of two shift register groups are stacked, where the start signal wire 3S2 and end signal wire 3T2 are stacked above start signal wire 3S1 and end signal wire 3T1.

Since the signal wires of the second shift register group are stacked above the signal wires of the first shift register group, the total width of all side-by-side arranged signal wires is width W3 which may only be the width of the start signal wire 3S1. Compared to FIG. 1, the width W3 is narrower than the width W1 so that, combined with FIG. 3, it is known that this embodiment may reduce the non-display area 300N of the array substrate 300.

Specifically, referring to FIGS. 1, 4, and 5, a direction directed by a solid arrow (not labeled) is a first axial direction, and the first axial direction is a vertical direction in FIGS. 1, 4 and 5. A direction perpendicular to the direction directed by the solid arrow is a second axial direction, and the second axial direction is a horizontal direction in FIGS. 1, 4 and 5. Moreover, a width of the corresponding structure stated in this embodiment is measured along the second axial direction.

When stacking the signal wires of one shift register group above the signal wires of the other shift register group, the signal wires may not have to be arranged side by side but may also be arranged in a stack, which may reduce a width of the signal wires extending along a horizontal direction by approximately 50% and also reduce the area of the side frame area by a considerable margin. Thus, a width of the non-display area 300N on the array substrate 300 may be narrower so that an area of the non-display area 300N may be reduced, and the display panel employing the array substrate 300 may realize a narrow side frame design. Specifically, a direction perpendicular to the display area 300N is a direction perpendicular to the non-display area 300V, where the direction points to a user's eyes.

Specifically, when stacking the signal wires of one shift register group above the signal wires of the other shift register group, there may be an insulating layer (not shown) between upper signal wires and lower signal wires, and the insulating layer may maintain the upper and lower signal wires nonconductive, where, along a direction perpendicular to a plane shown in FIG. 5, the upper signal wires are closer to a user's eyes and the lower signal wires are farther to a user's eyes. In fact, each of the signal wires may be insulated from other conductive structures except for both ends of each signal wire may be electrically connected to the shift registers.

As stated hereinbefore, there may have the insulating layer between the upper signal wires and lower signal wires. In order to stack the signal wires of one shift register group above the signal wires of the other shift register group, through holes (position of the through holes are shown as circles in FIG. 5, not labeled) and wires are formed in the insulating layer, and the wires may be electrically connected to the gate output ends of the corresponding shift registers by passing through the through holes so that the wires may become the signal wires in the insulating layer.

Specifically, although the gate driver in the second side frame area N32 (as shown in FIG. 3) is not shown, two shift register groups in the second side frame area N32 may employ a stack form as shown in FIG. 5. The signal wires may be stacked together so that a width of the second side frame area N32 occupied by the signal wires may be reduced and thus, the array substrate with an area-reduced first side frame area N31 and second side frame area N32 is achieved.

In another embodiment, a method for forming an array substrate is provided, which is used to form the array substrate 300. Referring to FIGS. 3 to 5, forming the array substrate may include: forming a gate driver in the non-display area 300N of the array substrate 300, where the non-display area 300N includes the first side frame area N31 and the second side frame area N32.

Forming the array substrate 300 may further include: the gate driver may be set including two shift register circuits, and each of the register circuits may be set including two shift register groups. In some embodiments, the gate driver may be set including M shift register circuits, where M is positive even number.

Forming the array substrate 300 may further include: two shift register circuits may be set being in the first side frame area N31 and second side frame side N32 respectively. The first side frame area N31 and second side frame side N32 may each have two shift register groups. In some embodiments, the gate driver may be completely in either the first side frame area N31 or the second side frame side N32.

In this embodiment, the gate driver is fabricated using at least one of: polycrystalline silicon (low temperature polycrystalline silicon), amorphous silicon or oxide semiconductor.

Forming the array substrate 300 may further include: each of the shift register groups may be set including N shift registers, where N is an integer greater than 2, and each of shift register circuits may be set including two shift register groups. In the two shift register groups of a same shift register circuit, driving signals of the two shift register groups may have a phase difference of a half clock period.

In one embodiment, in each of the shift register groups, the signal wires may be formed at a gate output end of an $n^{th}$ shift register. The end signal wire of the $n^{th}$ shift register is electrically connected to an $(n-1)^{th}$ shift register and the start signal wire of the $n^{th}$ shift register is electrically connected to an $(n+1)^{th}$ shift register, where n is a positive integer ranging from 1 to N, and N is a positive integer greater than two.

Forming the array substrate 300 may further include: along a direction perpendicular to the non-display area 300N, at least one of the signal wires of one shift register group may be formed above at least one of the signal wires of the other shift register group.

With reference to FIG. 4, the signal wires of a first shift register group may be formed, which may include the start signal wire 3S1 and the end signal wire 3T1. Simultaneously, gate output ends and an exit ports (not shown) may be formed in a same layer. An insulating layer (not shown) may be formed on a structure shown in FIG. 4, it may be formed between upper signal wires and lower signal wires. Through holes (position of the through holes are shown as circles in FIG. 5, not labeled) are formed in the insulating layer, and the through holes may be filled by conductive material till the signal wires of a second shift register group may be formed, which may include the start signal wire 3S2 and end signal wire 3T2 as shown in FIG. 5.

In the method for forming the array substrate provided in this embodiment, by forming the signal wires of one shift register group above the signal wires of the other shift register group, the area of the non-display area 300N occupied by the signal wires may be reduced. Moreover, the method provided in this embodiment may be simple in art, and more importantly, the formed array substrate 300 may realize a narrow side frame structure.

In another embodiment, an array substrate 400 is provided referring to FIGS. 6 to 10.

Figure 6:
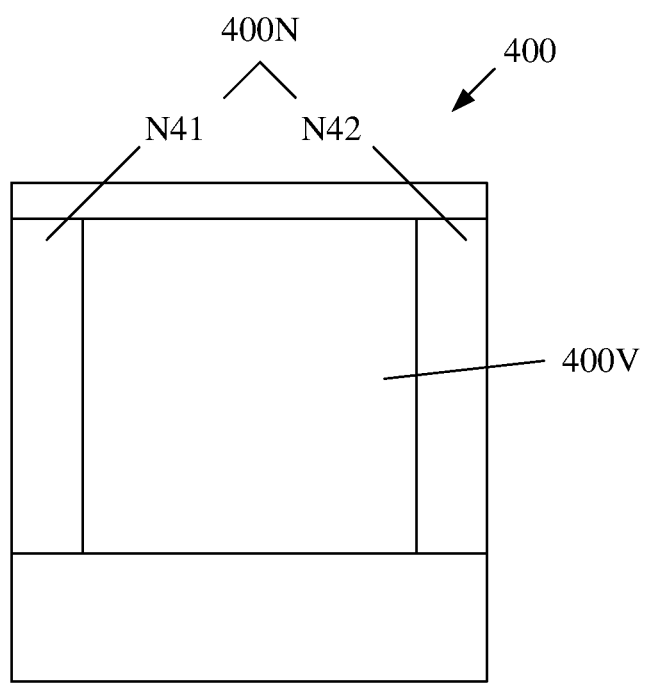
FIG. 6 schematically illustrates a diagram of an array substrate according to another embodiment of the present disclosure.

Referring to FIG. 6, a diagram of an array substrate according to another embodiment of the present disclosure is provided. The array substrate 400 provided in this embodiment includes a display area 400V and a non-display area 400N, and the non-display area 400N includes a first side frame area N41 and a second side frame area N42.

The array substrate 400 may include a gate driver in the non-display area 400N, which may include four shift register circuits and each of the shift register circuits may include two shift register groups so that the gate driver may include eight shift register groups in total. The first side frame area N41 may include four shift register groups, which are a first shift register group to a fourth shift register group. The second side frame area N42 may also include four shift register groups, which are a fifth shift register group to an eighth shift register group.

Figure 7:
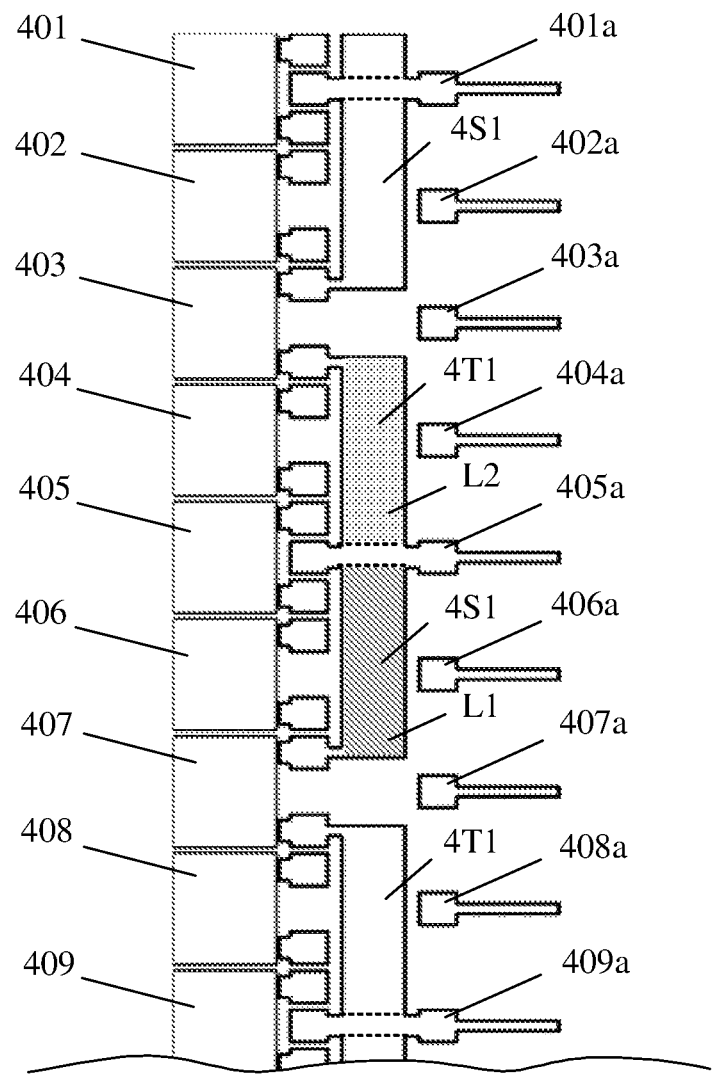
FIG. 7 schematically illustrates a diagram of signal wires in a first layer of a gate driver in a first side frame area of the array substrate shown in FIG. 6.
Figure 8:
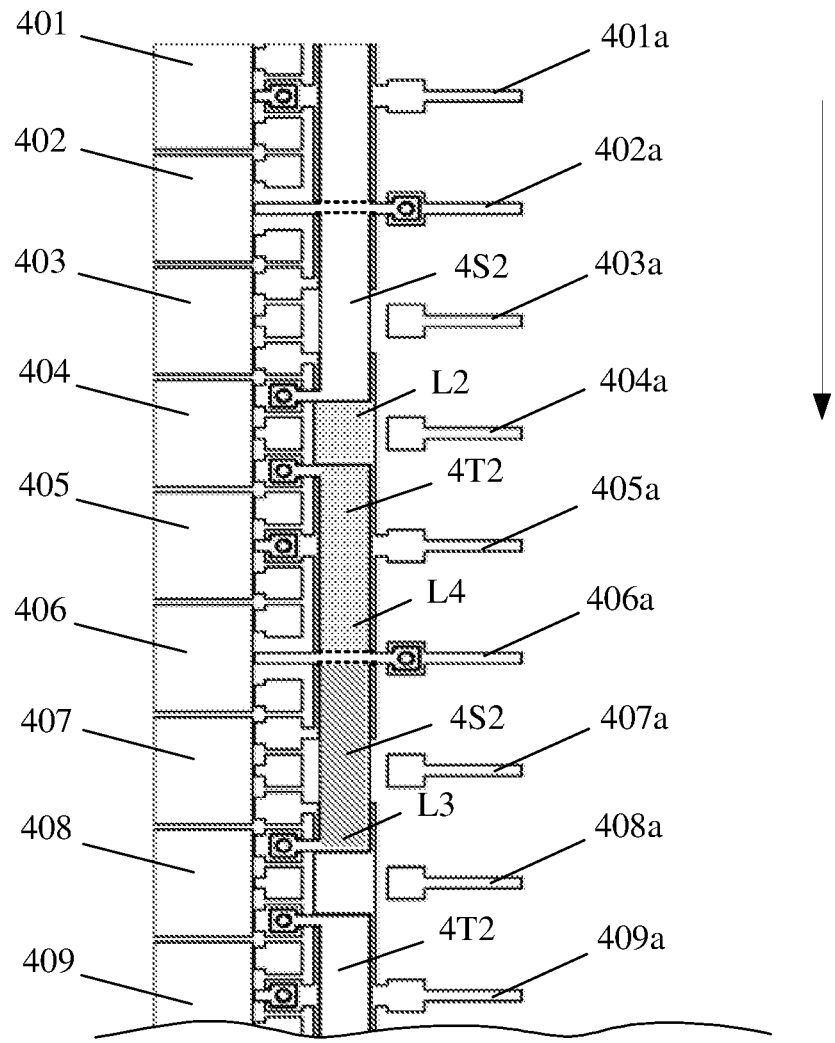
FIG. 8 schematically illustrates a diagram of signal wires in a second layer of the gate driver in the first side frame area of the array substrate shown in FIG. 6.
Figure 9:
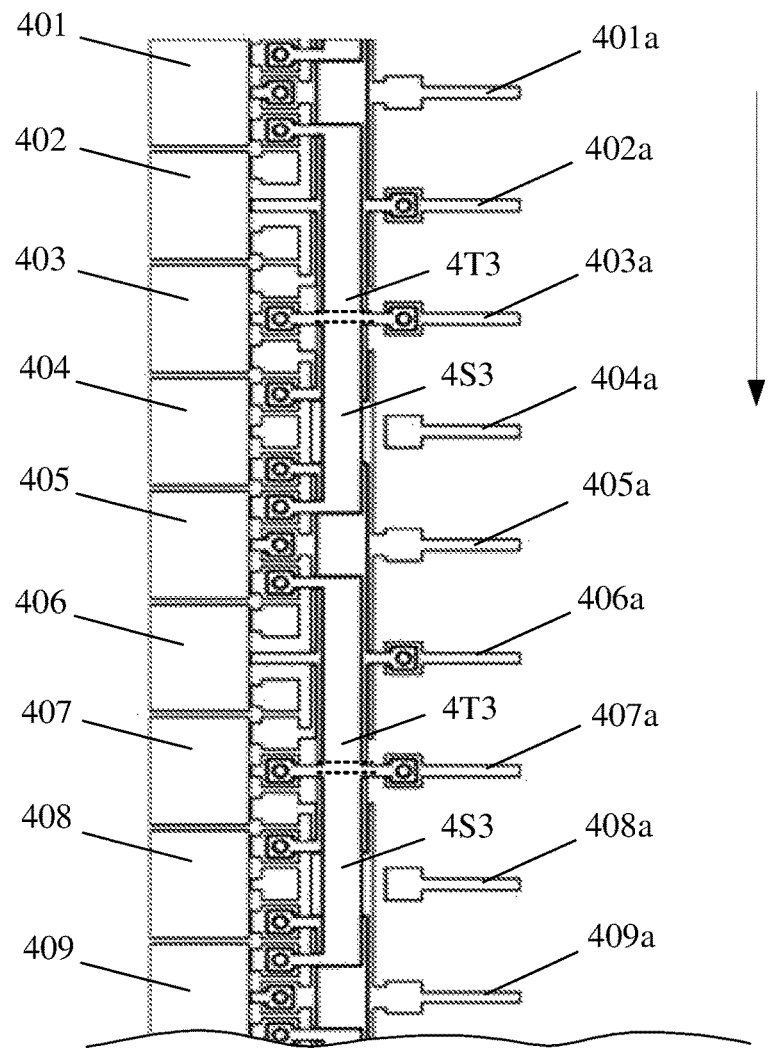
FIG. 9 schematically illustrates a diagram of signal wires in a third layer of the gate driver in the first side frame area of the array substrate shown in FIG. 6.
Figure 10:
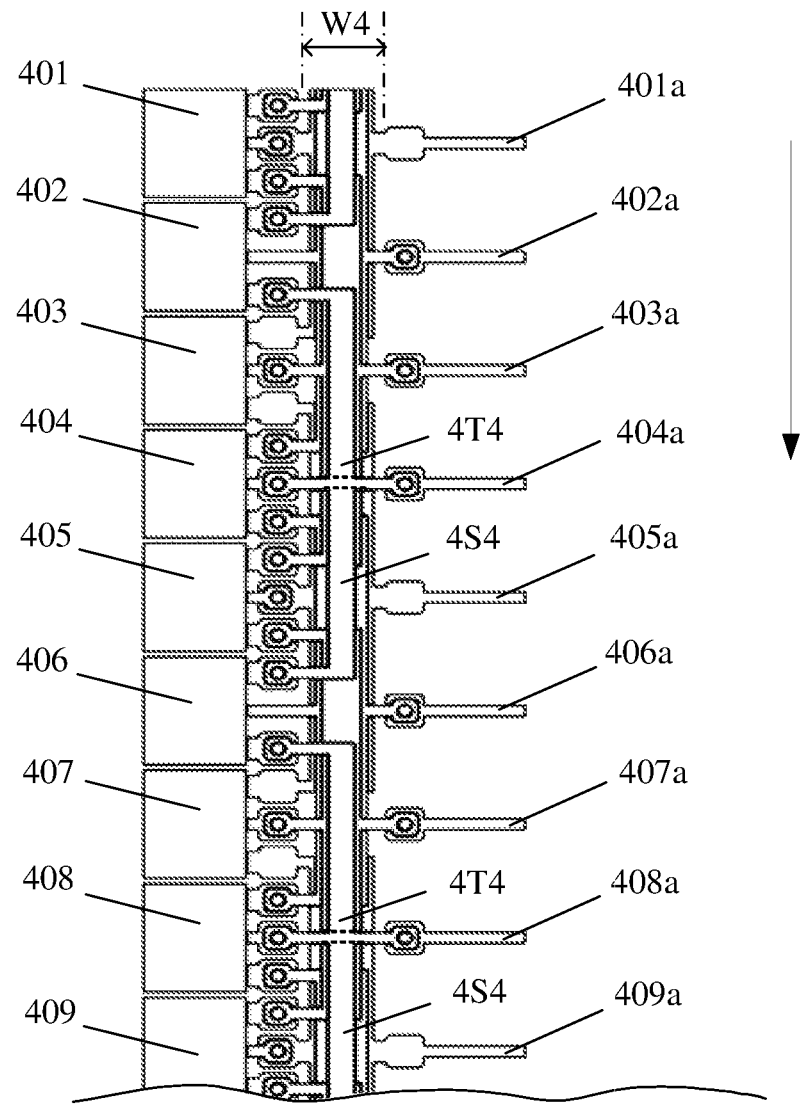
FIG. 10 schematically illustrates a diagram of signal wires in a fourth layer of the gate driver in the first side frame area of the array substrate shown in FIG. 6.

Referring to FIGS. 7 to 10, the gate driver included in the first side frame area N41 is shown, which may include the four shift register groups. FIG. 7 schematically illustrates a diagram of signal wires in a first layer of the gate driver of the array substrate 400. FIG. 8 schematically illustrates a diagram of signal wires in a second layer of the gate driver of the array substrate 400. FIG. 9 schematically illustrates a diagram of signal wires in a third layer of the gate driver of the array substrate 400, and FIG. 10 schematically illustrates a diagram of signal wires in a fourth layer of the gate driver of the array substrate 400.

In some embodiments, the gate driver may include M shift register circuits, where M is positive even number. In addition, each of the shift register circuits may include two shift register groups. In the two shift register groups of a same shift register circuit, driving signals of the two shift register groups may have a phase difference of a half clock period.

In this embodiment, each of the shift register groups may include N shift registers, where N is an integer greater than 2. Specifically, since there may have eight shift register groups in total, the gate driver may drive 8N pixel rows, where N may be one-eighth total number of the pixel rows. For example, when there are 768 pixel rows, each of the shift register groups includes 96 shift registers.

Referring to FIGS. 7 to 10, shift registers 401 to 409 are presented as representatives. Specifically, a $(4k-3)^{th}$ shift register may be included in the first shift register group, a $(4k-2)^{th}$ shift register may be included in the second shift register group, a $(4k-1)^{th}$ shift register may be included in the third shift register group and a $(4k)^{th}$ shift register may be included in the fourth shift register group, where k is a positive integer. Thus, the shift register 401, shift register 405 and shift register 409 are included in the first shift register group, shift register 402 and shift register 406 are included in the second shift register group, shift register 403 and shift register 407 are included in the third shift register group, and the shift register 404 and shift register 408 are included in the fourth shift register group.

In this embodiment, an $n^{th}$ shift register may always be arranged in front of a $(n+1)^{th}$ shift register, no matter whether the $n^{th}$ shift register and the $(n+1)^{th}$ shift register are in a same shift register group or not. The $n^{th}$ shift register in different shift register groups may be arranged consecutively in an order according to a group serial number. For example, the $n^{th}$ shift register of the first shift register group is arranged in front of the $n^{th}$ shift register of the second shift register group, and the $n^{th}$ shift register of the second shift register group is arranged in front of the $n^{th}$ shift register of the third shift register group. In addition, the $n^{th}$ shift register of the third shift register group is arranged in front of the $n^{th}$ shift register of the fourth shift register group.

In one embodiment, the shift registers 401 to 409 have gate output ends 401a to 409a respectively. In each of the shift register groups, the signal wires are formed at a gate output end of an $n^{th}$ shift register, which include an end signal wire and a start signal wire. The end signal wire is electrically connected to an $(n-1)^{th}$ shift register and the start signal wire is electrically connected to an $(n+1)^{th}$ shift register, where n is a positive integer ranging from 1 to N.

For example, when each of the shift register groups includes 96 shift registers, the second shift register to $95^{th}$ shift register all have the above feature. Namely, among three consecutive shift registers, a gate output end of the middle shift register has two signal wires that an end signal wire and a start signal wire. Effect and working principle of the end signal wire and start signal wire may refer to corresponding content of the first embodiment in this specification.

Referring to FIGS. 7 to 10, the shift registers in each of the shift register groups are interconnected by the signal wires. Referring to FIG. 7, the signal wires of the first shift register group includes a start signal wire 4S1 and an end signal wire 4T1. Referring to FIG. 8, the signal wires of the second shift register group includes a start signal wire 4S2 and an end signal wire 4T2. Referring to FIG. 9, the signal wires of the third shift register group includes a start signal wire 4S3 and an end signal wire 4T3. Referring to FIG. 10, the signal wires of the fourth shift register group includes a start signal wire 4S4 and an end signal wire 4T4.

Referring to FIGS. 7 to 10, along a direction perpendicular to the non-display area 400N, the signal wires of the four shift register groups may form a four-layer conductive structure. The signal wires of different shift register groups are stacked in an order from bottom to top. Four groups of the signal wires of the four shift register groups are stacked to form a stack structure shown in FIG. 10.

FIG. 10 is now compared to FIG. 2. As shown in FIG. 2, four groups of the signal wires of the four shift register groups are arranged side by side in the non-display area so that at least four signal wires are arranged side by side, where a side-by-side arranged part width of the signal wires may occupy 70 μm of the first side frame area generally (the area between two neighboring signal wires may also occupy a certain width). The width W2 shown in FIG. 2 may be generally 70 μm. Thereby, the side frame may extend and expand toward the display area, and the area of the side frame area may increase. However, as shown in FIG. 10, along the direction perpendicular to the non-display area 400N, the signal wires of one shift register group is stacked in order above the signal wires of another shift register group, which may greatly reduce a width occupied by the signal wires in the first side frame area N41. Namely, when applying this embodiment, since the signal wires may not be arranged side by side, the width W4 shown in FIG. 10 may be approximately a quarter of the width W2 shown in FIG. 2 (about 17.5 μm), consequently, the width of the side frame area may be greatly reduced.

With reference to FIGS. 2, 7, 8, 9 and 10, a direction directed by a solid arrow (not labeled) is a first axial direction, and the first axial direction is a vertical direction in FIGS. 2, 7, 8, 9 and 10. A direction perpendicular to the direction directed by a solid arrow is a second axial direction, and the second axial direction is a horizontal direction in FIGS. 2, 7, 8, 9 and 10. Moreover, a width of the corresponding structure in this embodiment is measured along the second axial direction.

In some embodiments, the signal wires of one shift register group are stacked above the signal wires of other three shift register groups, or the signal wires of two shift register groups are stacked above the signal wires of another two shift register groups, or the signal wires of three shift register groups are stacked above the signal wires of another shift register group.

In an embodiment, the end signal wire may further include a first segment L1 extending along the first axial direction, and the start signal wire may include a second segment L2 extending along the first axial direction.

This embodiment defines a part of each signal wire extending along the first axial direction as a segment. The first segment L1, as well as the second segment L2, is a segment said above. Inversely, the segment said above may include at least one of the first segment L1 or the second segment L2.

As shown in FIG. 7, the segment L1 is illustrated using a first shading, and the segment L2 is illustrated using a second shading. Referring to FIG. 7, the first segment L1 and second segment L2 of a same shift register group are on a same plane, and along a same straight line, where the straight line is parallel to the first axial direction.

As shown in FIG. 8, a first segment L3 and a second segment L4 of the second shift register group are illustrated using two different shadings. FIG. 8 further illustrates a part of the first segment L1 of the first shift register group. As shown in FIG. 8, the first segment and second segment of different shift register groups are not on a same plane but along a same straight line, where the straight line is parallel to the first axial direction. Thus, along a direction perpendicular to the non-display area 400N, the first segment L3 and second segment L4 of the second shift register group partially overlap the first segment L1 and second segment L2 of the first shift register group.

Referring to FIGS. 9 and 10, segments of the third and fourth shift register group are not labeled. However, in this embodiment, upper segments and lower segments are at least partially overlapped, where, along a direction perpendicular to a plane shown in FIG. 10, the upper signal wires are closer to a user's eyes and the lower signal wires are farther to a user's eyes. By at least partially overlapping segments of different shift register groups, the area occupied by the signal wires may be reduced.

Referring to FIGS. 8 to 10, in this embodiment, the upper segments are narrower in width than the lower segments. For example, the first segment L3 and second segment L4 are narrower in width than the first segment L1 and second segment L2. This structure may be beneficial for achieving a better stack pattern for upcoming segments.

Referring to FIGS. 8 to 10, in this embodiment, along a direction perpendicular to the non-display area 400N, at least part of the upper segments overlap the lower segments completely. The upper segments may be narrower in width than the lower segments, and thereby, referring to FIGS. 8 to 10, a part of the upper segments may completely overlap the lower segments. This stack form may further reduce a width of all stacked segments, and furthermore, this stack form may not only be easily proceeded but the stack also forms a relatively stable stack structure.

As shown in FIG. 10, in this embodiment, the signal wires of the four shift register groups are in different layers to form a four-layer conductive structure. All of the segments are arranged along the straight line and go through the straight line. A stack part of all segments may have a width of one signal wire so that the area of the side frame area may be saved and further realize the narrow side frame design.

In one embodiment, the array substrate 400 may further include a touch-control display structure (not shown) in the display area 400V, and the touch-display structure may include gate wires, data wires, common electrodes, pixel electrodes and touch-control display wires. Wherein, the common electrodes may be common electrodes of the display panel at a display stage and capacitance touch-control display electrodes at a touch-display stage. The touch-control display wires may electrically connect the common electrodes and across the pixel electrodes. The touch-control display wires may be display signal wires at the display stage and touch-control display signal wires at touch detection.

In one embodiment, the gate wires, data wires, common electrodes, pixel electrodes and touch-control display wires may each be in different layers to form a five-layer conductive structure. The signal wires of the four shift register groups stated hereinbefore may be in different layers to form a four-layer conductive structure.

In an embodiment, four layers of the four-layer conductive structure and four layers out of the five-layer conductive structure may be same in material. Moreover, the four layers of the four-layer conductive structure and the four layers out of the five-layer conductive structure are one-to-one joint.

Specifically, in the display area 400V, the gate wires and the signal wires of the first shift register group may be made of same material; in the display area 400V, the data wires and the signal wires of the second shift register group may be made of same material; in the display area 400V, the common electrodes and the signal wires of the third shift register group may be made of same material; in the display area 400V, the touch-control display wires and the signal wires of the fourth shift register group may be made of same material.

In one embodiment, the four-layer signal wires and the four-layer conductive structure in the display area 400V may respectively be made of same material. Conductive layers in the display area 400V may be used to manufacture the four-layer signal wires in one of the side frame areas (namely, the four-layer conductive structure). In some embodiments, any four layers out of the five-layer conductive structure may be employed to manufacture the four-layer conductive structure.

Specifically, for the gate driver in the second side frame area N42, corresponding signal wires may also have the four-layer conductive structure, and the four layers of the four-layer conductive structure and the four layers out of the five-layer conductive structure may respectively be same in material.

The array substrate 400 of this embodiment use each conductive-layer (including gate wires, data wires, common electrodes, pixel electrodes and touch-control display wires) material of an embedded self-capacitance touch-control structure to form the signal wires in the non-display area 400N, so that appropriate art may be employed to form the corresponding signal wires. Furthermore, the signal wires may be stacked, where the signal wires, which are originally arranged side by side, are stacked together, to save layout space, reduce the area of the non-display area 400N, realize the narrow side frame design and simplify manufacturing art.

Specifically, there may have an insulating layer (not shown) between upper signal wires and lower signal wires. In fact, except for two ends of each signal wire that may be electrically connected to shift registers, each of signal wires and other conductive structures may be insulated from each other.

Specifically, as stated hereinbefore, there may be an insulating layer between the upper signal wires and lower signal wires. In order to stack the signal wires of one shift register group above the signal wires of another shift register group, wires may be formed in the insulating layer via forming through holes in the insulating layer (circles shown in FIGS. 8 to 10 stand for the through holes, not labeled), and the wires may fill and go through the through holes so as to interconnect electrically the gate output ends of the corresponding shift registers, where the wires may become the corresponding signal wires in the insulating layer and namely, the ends of the signal wires electrically connect the shift registers via the through holes.

Specifically, FIGS. 7 to 10 only illustrate the gate driver in the first side frame area N41, and a structure of the gate driver in the second side frame area N42 and the structure of the gate driver in the first side frame area N41 may be basically the same, and thereby they may have certain symmetry. Thus, the gate driver in the second side frame area N42 may refer to the gate driver in the first side frame area N41.

Specifically, in some embodiments, when M is equal to six, the first side frame area and second side frame area may respectively have six shift register groups. Furthermore, in each side frame area, the signal wires of the six shift register groups may be in different six layers to form a six-layer conductive structure. The array substrate 400 may further include a touch-control display structure in the display area 400V, which may include gate wires, data wires, common electrodes, pixel electrodes, touch-control display wires, a polycrystalline silicon semiconductor layer and a conductive light-shielding layer each in different layers to form a seven-layer conductive structure. In the six shift register groups, six layers of the six-layer conductive structure and six layers out of the seven-layer conductive structure may be same in material. Moreover, the six layers of the six-layer conductive structure and the six layers out of the seven-layer conductive structure are one-to-one joint. Methods for forming the six layers out of the seven-layer conductive structure may be employed to form the six layers of the six-layer conductive structure respectively. Thus, the area of the side frame on the array substrate may be further reduced and realize a better narrow side frame design.

In another embodiment of the present disclosure, a method for forming another array substrate is provided, which is to form the array substrate 400 in the embodiment above, and thereby, the method may refer to corresponding content in the embodiment above.

Referring to FIG. 6, the method for forming the array substrate includes the display area 400V and non-display area 400N. The non-display area 400N includes the first side frame area N41 and second side frame area N42.

The method may include: forming a gate driver in the non-display area 400N, which may include four shift register circuits, each shift register circuit may include two shift register groups, and thereby, the gate driver may include eight shift register groups in total.

The method may further include: setting the gate driver being in both the first side frame area N41 and second side frame area N42 simultaneously. Wherein, the first side frame area N41 may include four shift register groups, which are a first shift register group to a fourth shift register group respectively, and the second side frame area N42 may also include four shift register groups, which are a fifth shift register group to an eighth shift register group respectively. FIGS. 7 to 10 illustrate a part of the shift registers in the four shift register groups in the first side frame area N41.

In some embodiments, the gate driver may include M shift register circuits, where M is a positive even number. Furthermore, each shift register circuit may include two shift register groups. In the two shift register groups of a same shift register circuit, driving signals of the two shift register groups may have a phase difference of a half clock period.

The method may further include: setting each shift register group including N shift registers, where N is a positive integer greater than 2. Specifically, there may have eight shift register groups so that the gate driver may correspondingly drive 8N pixel rows, where N may be one-eighth total number of pixel rows. For example, when there has 768 pixel rows, each shift register group includes 96 shift registers.

In one embodiment, the gate driver may be manufactured by using materials including polycrystalline silicon (low-temperature polycrystalline silicon), amorphous silicon or oxide semiconductor.

In one embodiment, for each shift register group, the signal wires may be formed at the gate output end of an $n^{th}$ shift register. The signal wires may include a start signal wire and an end signal wire, wherein the end signal wire is electrically connected to an $(n-1)^{th}$ shift register, and the start signal wire is electrically connected to an $(n+1)^{th}$ shift register, where n is a positive integer ranging from 1 to N.

The method may further include: along the direction perpendicular to the non-display area 400N, at least one of the signal wires of one shift register group may stack above at least one of the signal wires of another shift register group.

FIGS. 7 to 10 schematically illustrates shift registers 401 to 409 as representatives, which have gate output ends 401a to 409a correspondingly.

As shown in FIG. 7, the signal wires of the first shift register group include a start signal wire 4S1 and an end signal wire 4T1.

As shown in FIG. 8, the signal wires of the second shift register group include a start signal wire 4S2 and an end signal wire 4T2, which may be formed above the start signal wire 4S1 and the end signal wire 4T1.

As shown in FIG. 9, the signal wires of the third shift register group include a start signal wire 4S3 and an end signal wire 4T3, which may be formed above the start signal wire 4S2 and the end signal wire 4T2.

As shown in FIG. 10, the signal wires of the fourth shift register group include a start signal wire 4S4 and an end signal wire 4T4, which may be formed above the start signal wire 4S3 and the end signal wire 4T3.

Specifically, there may have an insulating layer (not shown) between upper signal wires and lower signal wires, where the insulating layer may maintain the upper and lower signal wires insulating. Moreover, in order to stack the signal wires of one shift register group above the signal wires of another shift register group, wires may be formed in the insulating layer via forming through holes in the insulating layer (circles shown in FIGS. 8 to 10 stand for the through holes, not labeled), and the wires may fill and go through the through holes so as to interconnect electrically the gate output ends of the corresponding shift registers, where the wires may become the corresponding signal wires in the insulating layer and namely, ends of the signal wires electrically connect the shift registers via the through holes.

In one embodiment, the end signal wire may include a first segment extending along a first axial direction, and the start signal wire may include a second segment extending along a first axial direction.

In one embodiment, along the direction perpendicular to the non-display area 400N, upper segments and lower segments are at least partially overlapped, where the upper and lower segments are either the first segment or the second segment.

In this embodiment, the upper segments may be narrower in width than the lower segments.

In this embodiment, along the direction perpendicular to the non-display area 400N, the upper segments and lower segments may be set being overlapped completely.

As shown in FIG. 10, in this embodiment, the signal wires of the four shift register groups are in different layers to form a four-layer conductive structure.

The method may further include: forming a touch-control display structure in the display area 400V. Forming the touch-display structure may include: forming gate wires, data wires, common electrodes, pixel electrodes and touch-control display wires. Wherein, the gate wires, data wires, common electrodes, pixel electrodes and touch-control display wires may be in different layers to form a five-layer conductive structure.

In one embodiment, the four layers of the four-layer conductive structure may respectively be formed employing same art for manufacturing the four layers out of the five-layer conductive structure. Specifically, the signal wires of the first shift register group may be formed simultaneously when manufacturing the gate wires in the display area 400V; the signal wires of the second shift register group may be formed simultaneously when manufacturing the data wires in the display area 400V; the signal wires of the third shift register group may be formed simultaneously when manufacturing the common electrodes in the display area 400V; the signal wires of the fourth shift register group may be formed simultaneously when manufacturing the touch-control display wires in the display area 400V.

The method provided in this embodiment, utilizing art for forming the touch-control display structure in the display area 400V, the gate driver may be formed simultaneously in the non-display area 400N. In the gate driver, the signal wires in different shift register groups may be stacked together, and thus, may form the array substrate with a smaller side frame area, achieve the narrow side frame design, simplify manufacturing art and reduce manufacturing cost.

Specifically, in some embodiments, when M may be equal to six, the first side frame area and second side frame area may be set including six shift register groups. In each side frame area, the signal wires of the six shift register groups may be set in different layers to form a six-layer conductive structure. The method may further include: forming a touch-control display structure in the display area 400V, wherein the formed touch-control display structure may include: forming gate wires, data wires, common electrodes, pixel electrodes, touch-control display wires, a polycrystalline silicon semiconductor layer and a conductive light-shielding layer, where the gate wires, data wires, common electrodes, pixel electrodes, touch-control display wires, polycrystalline silicon semiconductor layer and conductive light-shielding layer may be in different layers to form a seven-layer conductive structure. The six layers of the six-layer conductive structure may be formed simultaneously employing art for forming the six layers out of the seven-layer conductive structure.

The disclosure is disclosed as above, but not limited. Based on the disclosure of the disclosure, those skilled in the art can make any variation and modification without departing from the spirit of the disclosure. Therefore, an extent of patent protection of the present disclosure is accordance with the claims.

What is claimed is:

1. An array substrate, comprising:
  a gate driver in a non-display area, comprising M shift register circuits, each comprising at least a first shift register group and a second shift register group, wherein each of the first and second shift register groups comprises N shift registers, where M is a positive even number and N is a positive integer greater than two;
  wherein, in each of the first shift register groups and the second shift register groups, a gate output end of an $n^{th}$ shift register among the N shift registers is electrically connected to signal wires comprising an end signal wire and a start signal wire, wherein the end signal wire is electrically connected to an $(n-1)^{th}$ shift register and the start signal wire is electrically connected to an $(n+1)^{th}$ shift register, where n is a positive integer greater than 1 and smaller than N;
  wherein in each of the first shift register groups and the second shift register groups, the end signal wire connected to the gate output end of the $n^{th}$ shift register comprises a first segment extending along a column; wherein in each of the first shift register groups and the second shift register groups, the start signal wire connected to the gate output end of the $n^{th}$ shift register comprises a second segment extending along the column; and wherein a segment in an upper layer at least partially overlays one or more segments in a lower layer;
  wherein, along a direction perpendicular to the non-display area, at least one of the signal wires of the first shift register group is stacked above and overlaps at least one of the signal wires of the second shift register group;
  wherein in each of the M shift register circuits, the shift registers of the first and second register groups are arranged in the column, the $n^{th}$ shift registers in the first and the second register groups arranged adjacent to each other in the column, and the start and end signal wires of a same group are arranged in a same layer, and the start and end signal wires of different groups are arranged in different layers; and
  wherein in each of the M shift register circuits, a shift register in another group is arranged between every two registers in a same group, and a start signal wire and an end signal wire for connecting two registers in the same group are not connected to a shift register in another group.

2. The array substrate according to claim 1, wherein M equals four, and wherein the segments in the upper layer are narrower in width than the segments in the lower layer along a row, wherein the row is perpendicular to the columns.

3. The array substrate according to claim 2, wherein, the segments each in the upper layer comprises a plurality of subsections arranged in rows, wherein at least one row of the plurality of subsections in the upper segment is shielded by the segment in the lower layer, and wherein at least one of the segments in the upper layer overlays fully with one of the segments in the lower layer.

4. The array substrate according to claim 3, wherein the non-display area comprises a first frame area and a second frame area, wherein the first frame area and second frame area each comprise four shift register groups each comprising the first shift register group and the second shift register group, where the start and end signal wires of the four shift register groups form a first conductive structure comprising four conductive layers.

5. The array substrate according to claim 4, further comprising a touch-control display structure in a display area, wherein the touch-display structure comprises gate wires, data wires, common electrodes, pixel electrodes and touch-control display wires, forming collectively a second conductive structure comprising five conductive layers, and wherein four conductive layers out of the second conductive structure and the four conductive layers of the first conductive structure are configured to form 1:1 connections, and wherein all conductive layers are made of a same material.

6. The array substrate according to claim 1, wherein M equals six, and wherein the segments each in the upper layer is narrower in width than segments each in the lower layer along the row, wherein the row is perpendicular to the column.

7. The array substrate according to claim 6, wherein the non-display area comprises a first frame area and a second frame area, and the first frame area and second frame area each comprises six shift register groups comprising each the first shift register group and the second shift register group, wherein the start and end signal wires of the six shift register groups form a third conductive structure comprising six conductive layers.

8. The array substrate according to claim 7, further comprising a touch-control display structure in the display area, wherein the touch-control display structure comprises gate wires, data wires, common electrodes, pixel electrodes, touch-control display wires, a polycrystalline silicon semiconductor layer, and a conductive light-shielding layer, forming collectively a fourth conductive structure comprising seven conductive layers, and wherein six conductive layers out of the fourth conductive structure and the six layers of the third conductive structure are configured to form 1:1 connections, and wherein all conductive layers are made of a same material.

9. A method for forming an array substrate, comprising:
  forming a gate driver in a non-display area, wherein the gate driver comprises M shift register circuits, each comprising a first shift register group and a second shift register group, wherein M is a positive even number;
  wherein each of the first shift register group and the second shift register group comprises N shift registers, wherein N is a positive integer greater than two;
  forming signal wires electrically connected to a gate output end of an $n^{th}$ shift register among the N shift registers, wherein the signal wires comprise an end signal wire and a start signal wire, wherein in each of the first shift register groups and the second shift register groups, the end signal wire connected to the gate output end of the $n^{th}$ shift register comprises a first segment extending along a column; wherein in each of the first shift register groups and the second shift register groups, the start signal wire connected to the gate output end of the $n^{th}$ shift register comprises a second segment extending along the column; and wherein a segment in an upper layer at least partially overlays one or more segments in a lower layer;
  connecting the end signal wire to an $(n-1)^{th}$ shift register; and
  connecting the start signal wire to an $(n+1)^{th}$ shift register, wherein n is a positive integer greater than 1 and smaller than N; wherein at least one of the signal wires of the first shift register group overlays at least one of the signal wires of the second shift register group;

wherein in each of the M shift register circuits, the shift registers of the first and second register groups are arranged in the column, the n$^{th}$ shift registers in the first and the second register groups arranged adjacent to each other in the column, and the start and end signal wires of a same group are arranged in a same layer, and the start and end signal wires of different groups are arranged in different layers, and wherein in each of the M shift register circuits, a shift register in another group is arranged between every two registers in a same group, and a start signal wire and an end signal wire for connecting two registers in the same group are not connected to the shift register in another group.

10. The method according to claim 9, wherein M equals four, and wherein the segments each in the upper layer is narrower in width than the segments each in the lower layer along a row, wherein the row is perpendicular to the column.

11. The method according to claim 10, wherein, the segments each in an upper layer comprises a plurality of subsections arranged in rows, wherein at least one row of the plurality of subsections in an upper segment is shielded by the segment in a lower layer, and wherein at least one of the segments in an upper layer overlays fully with one of the segments in a lower layer.

12. The method according to claim 11, wherein the non-display area comprises a first frame area and a second frame area, wherein the first frame area and second frame area each comprise four shift register groups each comprising the first shift register group and the second shift register group, where the start and end signal wires of the four shift register groups form a first conductive structure comprising four conductive layers.

13. The method according to claim 12, further comprising forming a touch-control display structure in a display area, wherein forming the touch-control display structure in a display area comprises: forming gate wires, data wires, common electrodes, pixel electrodes and touch-control display wires, which collectively form a second conductive structure comprising five conductive layers, and forming the first conductive structure simultaneously while forming four layers out of the second conductive structure.

14. The method according to claim 9, wherein M equals six, and wherein the segments in the upper layer are narrower in width than segments in the lower layer along rows, wherein rows are perpendicular to columns.

15. The method according to claim 14, wherein the non-display area comprises a first frame area and a second frame area, and the first frame area and second frame area each comprises six shift register groups each comprising the first shift register group and the second shift register group, wherein the start and end signal wires of the six shift register groups form a third conductive structure comprising six conductive layers.

16. The method according to claim 15, further comprising forming a touch-control display structure in the display area, where forming the touch-control display structure comprises: forming gate wires, data wires, common electrodes, pixel electrodes, touch-control display wires, a polycrystalline silicon semiconductor layer and a conductive light-shielding layer, which collectively form a fourth conductive structure comprising seven conductive layers, and forming the third conductive structure simultaneously while forming six layers out of the fourth conductive structure.

* * * * *